(12) United States Patent
Yang et al.

(10) Patent No.: US 10,840,371 B2
(45) Date of Patent: Nov. 17, 2020

(54) ULTRA HIGH VOLTAGE SEMICONDUCTOR DEVICE WITH ELECTROSTATIC DISCHARGE CAPABILITIES

(71) Applicant: Taiwan Semiconductor Manufacturing Company, Ltd., Hsinchu (TW)

(72) Inventors: Tsai-Feng Yang, Hualien County (TW); Chih-Heng Shen, Hsinchu County (TW); Chun-Yi Yang, Hsinchu (TW); Kun-Ming Huang, Taipei (TW); Po-Tao Chu, New Taipei (TW); Shen-Ping Wang, Keelung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/663,654

(22) Filed: Oct. 25, 2019

(65) Prior Publication Data

US 2020/0066902 A1 Feb. 27, 2020

Related U.S. Application Data

(60) Continuation of application No. 15/882,193, filed on Jan. 29, 2018, now Pat. No. 10,461,183, which is a
(Continued)

(51) Int. Cl.
*H01L 21/76* (2006.01)
*H01L 29/66* (2006.01)
(Continued)

(52) U.S. Cl.
CPC ...... *H01L 29/7823* (2013.01); *H01L 29/0623* (2013.01); *H01L 29/0692* (2013.01); *H01L 29/0696* (2013.01); *H01L 29/0869* (2013.01); *H01L 29/0878* (2013.01); *H01L 29/0886* (2013.01); *H01L 29/1083* (2013.01); *H01L 29/41758* (2013.01); *H01L 29/41766* (2013.01); *H01L 29/66681* (2013.01);
(Continued)

(58) Field of Classification Search
None
See application file for complete search history.

(56) References Cited

U.S. PATENT DOCUMENTS 8,004,040 B2 8/2011 Ichijo et al.
8,610,208 B2 12/2013 Kim et al.
(Continued)

*Primary Examiner* — Daniel Whalen
(74) *Attorney, Agent, or Firm* — Haynes and Boone, LLP

(57) ABSTRACT

The method comprises forming a drain region in the first layer. The drain region is formed comprising a drain rectangular portion having a first end and a second end, a first drain end portion contiguous with the drain rectangular portion and extending from the first end of the drain rectangular portion away from a center of the drain region, and a second drain end portion contiguous with the drain rectangular portion and extending from the second end of the drain rectangular portion away from the center of the drain region. The method also comprises forming a source region free from contact with and surrounding the drain region in the first layer.

20 Claims, 4 Drawing Sheets

Related U.S. Application Data continuation of application No. 15/094,605, filed on Apr. 8, 2016, now Pat. No. 9,882,046, which is a division of application No. 14/220,828, filed on Mar. 20, 2014, now Pat. No. 9,312,348.

(60) Provisional application No. 61/940,231, filed on Feb. 14, 2014.

(51) Int. Cl.
| | | |
|---|---|---|
| *H01L 29/78* | (2006.01) | |
| *H01L 29/417* | (2006.01) | |
| *H01L 29/06* | (2006.01) | |
| *H01L 29/08* | (2006.01) | |
| *H01L 29/10* | (2006.01) | |
| H01L 27/02 | (2006.01) | |
| H01L 29/423 | (2006.01) | |

(52) U.S. Cl.
CPC .... *H01L 29/66696* (2013.01); *H01L 29/7816* (2013.01); *H01L 29/7824* (2013.01); *H01L 27/0266* (2013.01); *H01L 29/42368* (2013.01)

(56) References Cited

U.S. PATENT DOCUMENTS

| | | |
|---|---|---|
| 8,674,435 B2 | 3/2014 | Kang et al. |
| 9,312,348 B2 | 4/2016 | Yang et al. |
| 9,882,046 B2 * | 1/2018 | Yang .................... H01L 29/7823 |
| 2009/0101990 A1 | 4/2009 | Kang et al. |
| 2009/0159970 A1 * | 6/2009 | Ichijo ................. H01L 29/0634 |
| | | 257/343 |

* cited by examiner

ULTRA HIGH VOLTAGE SEMICONDUCTOR DEVICE WITH ELECTROSTATIC DISCHARGE CAPABILITIES

PRIORITY DATA

The present application is a continuation of U.S. patent application Ser. No. 15/882,193, filed Jan. 29, 2018, issuing as U.S. Pat. No. 10,461,183, which is a continuation application of U.S. patent application Ser. No. 15/094,605, filed Apr. 8, 2016, issuing as U.S. Pat. No 9,882,046, which is a divisional application of U.S. patent application Ser. No. 14/220,828, filed Mar. 20, 2014, now U.S. Pat. No. 9,312,348, which claims priority to Provisional Application Ser. No. 61/940,231 filed on Feb. 14, 2014, entitled "ULTRA HIGH VOLTAGE SEMICONDUCTOR DEVICE WITH ELECTROSTATIC DISCHARGE CAPABILITIES", each of which is hereby incorporated by reference in its entirety.

BACKGROUND

Technological advances in semiconductor integrated circuit (IC) materials, design, processing, and manufacturing have enabled ever-shrinking IC devices, where each generation has smaller and more complex circuits than the previous generation. Ultra high voltage (UHV) semiconductor devices such as UHV lateral diffusion metal-oxide-semiconductor (LDMOS) devices are used in some IC devices for power management. UHV LDMOS devices are often exposed to electrical static and electrical noise from inside and outside an IC device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
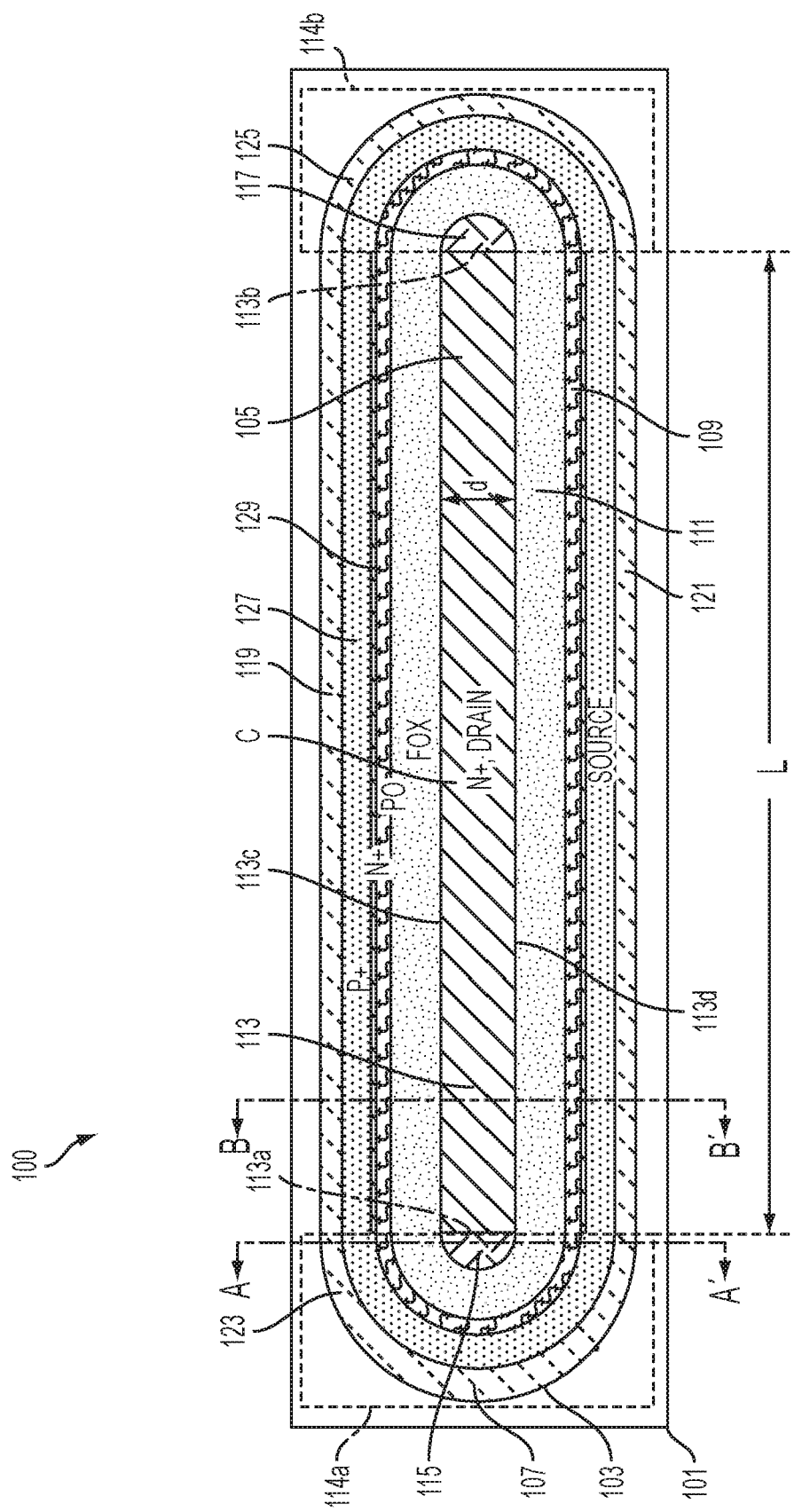
FIG. 1 is a top view of a semiconductor device having electrostatic discharge capabilities, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Electrical overstress (EOS) is often detrimental to integrated circuit (IC) device performance. Electrical overstress occurs when an electrical device is exposed to a current or a voltage that is beyond the maximum rating for the electrical device. Electro-static discharge (ESD) capabilities, or self-protection from EOS, are beneficial for integrated circuit (IC) device performance. Some IC devices include ultra high voltage lateral diffusion metal-oxide-semiconductor (UHV LDMOS) devices. Conventional UHV LDMOS devices; however, are often weak with respect to EOS self-protection and have low on-breakdown voltage thresholds, which limit device performance. UHV LDMOS devices are susceptible to electrical static and electrical noise to which an UHV LDMOS device is exposed from inside and/or outside an IC device that includes the UHV LDMOS device. To account for the lack of EOS self-protection that conventional UHV LDMOS devices provide, some IC devices include additional circuitry to protect the UHV LDMOS device and/or the IC device as a whole from EOS. This extra circuitry increases the complexity, size, and cost of some IC devices.

FIG. 1 is a top view of a semiconductor device 100 having electrostatic discharge capabilities, in accordance with one or more embodiments.

The semiconductor device 100 comprises a semiconductor substrate 101, a first layer 103 over the semiconductor substrate, a drain region 105, a source region 107, a gate electrode layer 109 and an insulation layer 111. The drain region 105 and the source region 107 are in the first layer 103. The gate electrode layer 109 is a polycrystalline silicon (polysilicon) layer or a doped polysilicon layer and gate electrode layer 109 is over the first layer 103 and at least partially over the insulation layer 111. The insulation layer 111 is over, or at least partially within, the first layer 103.

The drain region 105 comprises a drain rectangular portion 113 having a first end 113a and a second end 113b. The drain rectangular portion 113 is the portion of the drain region 105 outside of and between imaginary boxes 114a and 114b. Imaginary boxes 114a and 114b are depicted in FIG. 1 to help clarify the positional relationship between the drain rectangular portion 113 with respect to other portions of the drain region 105 and the source region 107. Imaginary box 114a is positioned at the first end 113a of the drain rectangular portion 113. Imaginary box 114b is positioned at the second end 113b of the drain rectangular portion 113. Imaginary boxes 114a and 114b are arranged orthogonally to the drain rectangular portion 113. Because the drain rectangular portion 113 is outside of the imaginary boxes 114a and 114b, imaginary box 114a encompasses portions of the drain region 105 other than the drain rectangular portion 113 on the first end 113a side of the drain rectangular portion 113, and imaginary box 114b encompasses portions of the drain region 105 outside of the drain rectangular portion 113 on the second end 113b side of the drain rectangular portion 113.

The drain region 105 also comprises a first drain end portion 115 contiguous with the drain rectangular portion 113 and extending from the first end 113a of the drain rectangular portion 113 away from a center C of the drain region 105. The first drain end portion 115 is the portion of the drain region 105 that is included within imaginary box 114a. The drain region 105 further comprises a second drain end portion 117 contiguous with the drain rectangular portion 113 and extending from the second end 113b of the drain rectangular portion 113 away from the center C of the drain region 105. The second drain end portion 117 is the portion of the drain region 105 that is included within imaginary box 114b. The first drain end portion 115 and the second drain end portion 117 are semicircular. In some embodiments, though illustrated as being semicircular, the first drain end portion 115 and the second drain end portion 117 are another shape such as a square, a rectangle, a triangle, a trapezoid, a parallelogram, an arc, other suitable shape, outline, or combination thereof. In some embodiments, the first drain end portion 115 is a different shape from the shape of the second drain end portion 117.

The first drain end portion 115 and the second drain end portion 117 have a same doping type. The first drain end portion 115 and the second drain end portion 117 have a different doping concentration as compared to the drain rectangular portion 113. For example, in some embodiments the drain region 105 is an n-type doped region. If the drain region 105 is an n-type doped region, then the n-type doping of the drain rectangular portion 113 is an N+/− doped region. The first drain end portion 115 and the second drain end portion 117 are free from having N+ doping and are instead n-type doped.

The source region 107 is free from contact with, and surrounds, the drain region 105 in the first layer 103. The source region 107 comprises a first source rectangular portion 119 parallel to, and aligned with, the drain rectangular portion 113. The first source rectangular portion 119 is the portion of the source region 107 outside of and between imaginary boxes 114a and 114b on a first side 113c of the drain rectangular portion 113. The source region 107 also comprises a second source rectangular portion 121 parallel to, and aligned with, the drain rectangular portion 113. The first source rectangular portion 119 is the portion of the source region 107 outside of and between imaginary boxes 114a and 114b on a second side 113d of the drain rectangular portion 113. Imaginary boxes 114a and 114b are arranged orthogonally to the first source rectangular portion 119 and the second source rectangular portion 121. Because the first source rectangular portion 119 and the second source rectangular portion 121 are outside of and between the imaginary boxes 114a and 114b, imaginary box 114a encompasses portions of the source region 107 other than the first source rectangular portion 119 and the second source rectangular portion 121 on the first end 113a side of the drain rectangular portion 113, and imaginary box 114b encompasses portions of the source region 107 outside of the first source rectangular portion 119 and the second source rectangular portion 121 on the second end 113b side of the drain rectangular portion 113.

The source region 107 further comprises a first source end portion 123 coupling the first source rectangular portion 119 to the second source rectangular portion 121 on a first end side of the drain rectangular portion 113 corresponding to the first end 113a of the drain rectangular portion 113. The first source end portion 123 is the portion of the source region 107 that is included within imaginary box 114a. The source region 107 additionally comprises a second source end portion 125 coupling the first source rectangular portion 119 to the second source rectangular portion 121 on a second end side of the drain rectangular portion 113 corresponding to the second end 113b of the drain rectangular portion 113. The second source end portion 125 is the portion of the source region 107 that is included within imaginary box 114b.

The first source end portion 123 and the second source end portion 125 are semicircular and concentric with the corresponding first drain end portion 115 and the second drain end portion 117. In some embodiments, the first source end portion 123 and the second source end portion 125 are another shape such as a square, a rectangle, a triangle, a trapezoid, a parallelogram, an arc, other suitable shape, outline, or combination thereof. In some embodiments, the first source end portion 123 is a different shape from the shape of the second source end portion 125.

A first well region 127 is formed within the source region 107. The first well region 127 is in the first source rectangular portion 119, the second source rectangular portion 121, the first source end portion 123 and the second source rectangular portion 125. The first well region 127 has a same doping type and a different doping concentration as compared to the source region 107. The doping type of the source region 107 differs from the doping type of the drain region 105. In a given example, if the drain region 105 is an n-type doped region, source region 107 is a p-type doped region. Accordingly, in some embodiments, if the drain region 105 is an n-type doped region, the source region 107 is a p-type doped region, and first well region 127 in the source region 107 is a P+-doped region.

A second well region 129 is formed within the source region 107. The second well region 129, unlike the first well region 127, is only in the first source rectangular portion 119 and the second source rectangular portion 121. The first source end portion 123 and the second source end portion 125 are entirely free from the second well region 129. The second well region 129 has a same doping type and a same doping concentration as compared to the drain rectangular portion 113. In a given example, if the drain region 105 is an n-type doped region, the drain rectangular portion 113 is an N+-doped region, and the second well region 129 is also an N+-doped region. In some embodiments, in addition to being entirely free from the second well region 129, the first source end portion 123 and the second source end portion 125 are entirely doped having the same doping type as the source region 107. For example, in some embodiments, the first source end portion 123 and the second source end portion 125 are entirely p-type doped.

The gate electrode layer 109 is over the first layer 103, and at least partially over the insulation layer 111, and is free from being in contact with the drain region 105. The gate electrode layer 109, for example, forms a gate over the first layer 103.

The insulation layer 111 is over the first layer 103, or is at least partially within the first layer 103. The insulation layer 111 is between the source region 107 and the drain region 105, and also between the gate electrode layer 109 and the drain region 105. The insulation layer 111 is, for example, an oxide such as a field oxide either formed on or buried in the first layer 103. In some embodiments, the first layer 105 has a trench formed between the source region 107 and the drain region 105 within which the insulation layer 111 is formed.

The drain rectangular portion 113 has a length L between the first end 113a and the second end 113b of the drain rectangular portion 113 and a width d perpendicular to the length L. The first source rectangular portion 119 and the second source rectangular portion 121 each have lengths that are equal to the length L of the drain rectangular portion 113. The width d of the drain rectangular portion 113 is equal to a width of the drain region 105 between the first drain end portion 115 and the second drain end portion 117. In some embodiments, the width d of the drain rectangular portion 113 is less than the width of the drain region 105 between the first drain end portion 115 and the second drain end portion 117. In some embodiments, the second well region 129 in the source region 107 has an overall length that is two times the length L of the drain rectangular portion 113 (i.e., by adding the length of the portion of the second well region 129 in the first source rectangular portion 119 to the length of the portion of the second well region 129 in the second source rectangular portion 121).

In some embodiments, the semiconductor substrate 101 is a semiconductor substrate comprising silicon. Alternatively, the substrate 101 comprises an elementary semiconductor including silicon and/or germanium in crystal; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; combinations thereof, or one or more other suitable materials. In some embodiments, first layer 103 is directly over the semiconductor substrate 101. In other embodiments, the semiconductor device 100 comprises any number of layers between the semiconductor substrate 101 and the first layer 103.

The drain region 105, the source region 107, the drain rectangular portion 113, the first drain end portion 115, the second drain end portion 117, the first source rectangular portion 119, the second source rectangular portion 121, the first source end portion 123, the second source end portion 125, the first well 127, and the second well 129 are doped regions having p-type doping or n-type doping at various concentrations. The doped regions, in some embodiments, are doped with p-type dopants, such as boron, $BF_2$, or other suitable dopant, or n-type dopants, such as phosphorus, arsenic, or other suitable dopant; or a combination thereof.

Compared to conventional UHV LDMOS devices, the semiconductor device 100 has an ESD performance that is 100% better than conventional UHV LDMOS devices. For example, in a human-body-model simulation designed to compare ESD performance capabilities of the semiconductor device 100 with the ESD performance capabilities of a conventional UHV LDMOS device if these devices were touched by a human being, the semiconductor device 100 had an ESD of 1500 V while the conventional UHV LDMOS device had an ESD of only 750 V. The semiconductor device 100 also experienced a higher on-breakdown voltage than the conventional UHV LDMOS device. For example, in an on-breakdown voltage simulation in which a ground voltage was set at Vg=15 V, and current through the semiconductor device 100 and the conventional UHV LDMOS device continually increased from 0 A to about 0.45 A, the semiconductor device 100 experienced an on-breakdown voltage of 505 V while the conventional UHV LDMOS device experienced an on-breakdown voltage of only 183 V. The semiconductor device 100 yielded an on-breakdown voltage improvement of 176% in the example simulation. In addition to the on-breakdown voltage improvement, the off-breakdown voltage between the semiconductor device 100 and the conventional UHV LDMOS device remained the same at 545 V.

Figure 2:
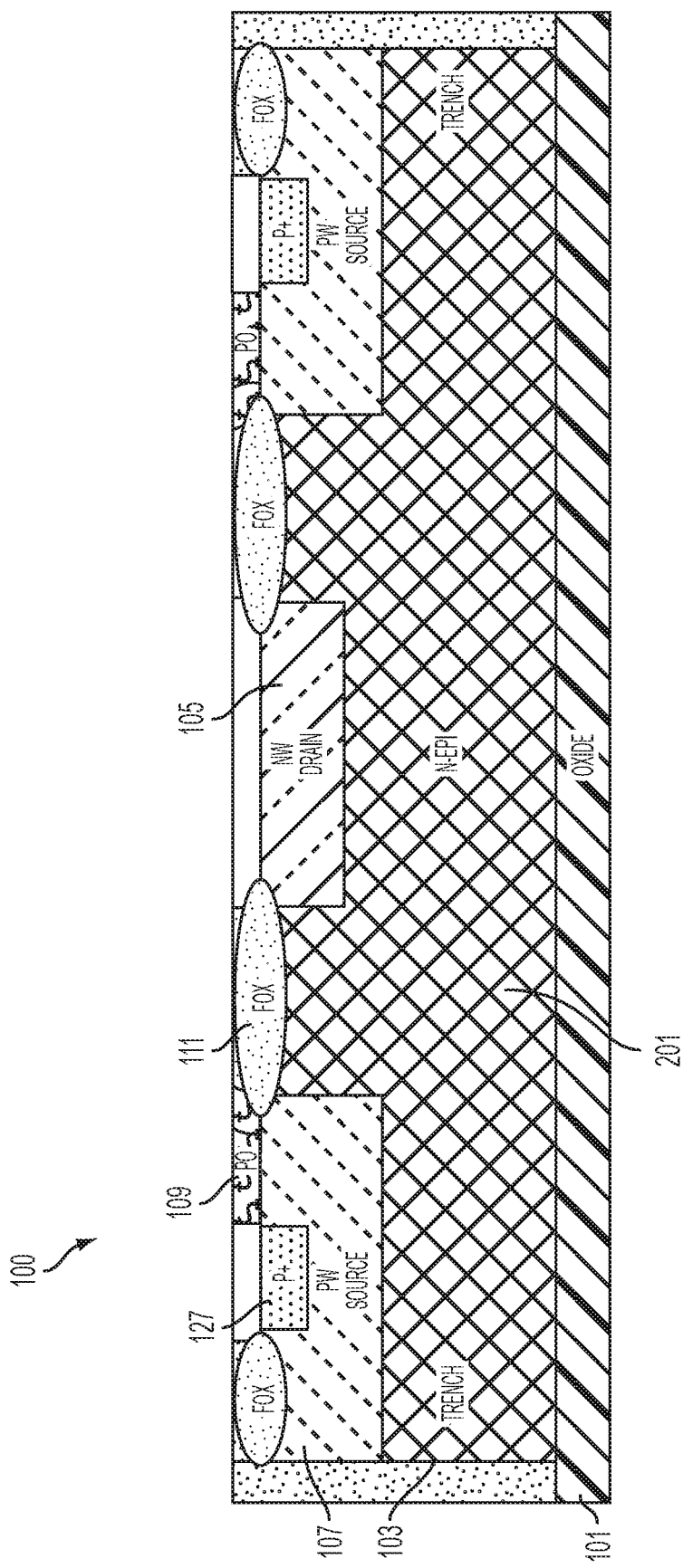
FIG. 2 is a cross-sectional view of the semiconductor device of FIG. 1, in accordance with some embodiments.

FIG. 2 is a cross-section view of semiconductor device 100 taken along cross-section A-A' illustrated in FIG. 1, in accordance with one or more embodiments.

Cross-section A-A' is taken through the first drain end portion 115 (FIG. 1) and the first source end portion 123 (FIG. 1). The first layer 103 is over the semiconductor substrate 101. The drain region 105 is in the first layer 103. The source region 107 is in the first layer 103 and is free from contact with the drain region 105 as the source region 107 is separated from the drain region 105 by a drift region 201. The drift region 201 is the portion of the first layer 103 not occupied by and between the source region 107 and the drain region 105. The source region 107 is also separated from the drain region 105 by insulating layer 111. The gate electrode layer 109 is over the first layer 103 and is free from contact with the drain region 105.

As seen in cross-section A-A', the first drain end portion 115 has the same doping type and concentration as the drain region 105 and is free from the different or increased doping concentration of the drain rectangular portion 113 (FIG. 1), e.g. an N+-doped region. Similarly, source end portion 123 has a first well 127 that is formed within the source region 107, but the first source end portion 123 is free from the second well 129 (FIG. 1).

Figure 3:
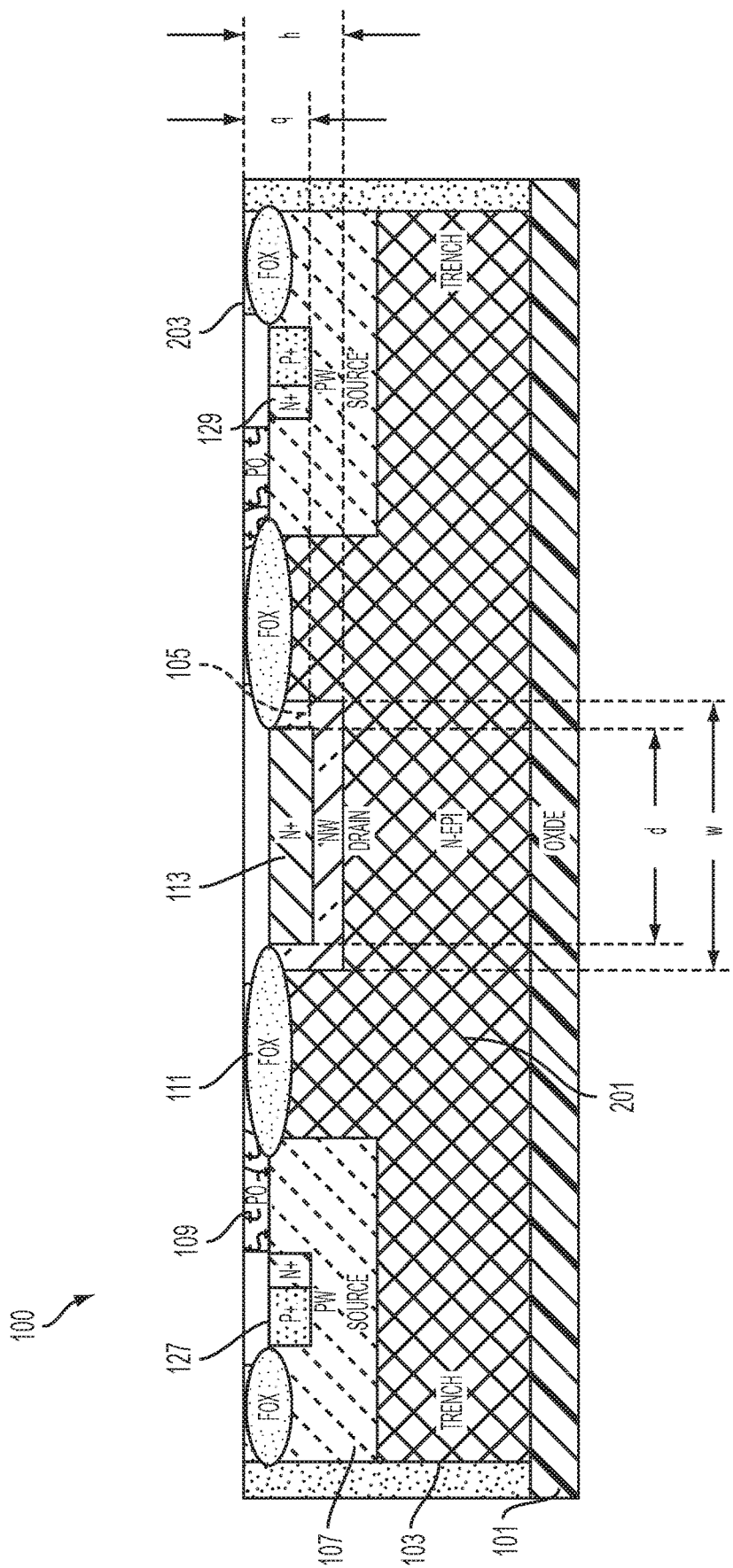
FIG. 3 is a cross-sectional view of the semiconductor device of FIG. 1, in accordance with some embodiments.

FIG. 3 is a cross-section view of semiconductor device 100 taken along cross-section B-B' of FIG. 1, in accordance with one or more embodiments.

Cross-section B-B' is taken through the drain rectangular portion 113, the first source rectangular portion 119 (FIG. 1) and the second source rectangular portion 121 (FIG. 1). The first layer 103 is over the semiconductor substrate 101. The drain region 105 is in the first layer 103. The source region 107 is in the first layer 103 and is free from contact with the drain region 105 as the source region 107 is separated from the drain region 105 by the drift region 201. The source region 107 is also separated from the drain region 105 by insulating layer 111. The gate electrode layer 109 is over the first layer 103 and is free from contact with the drain region 105.

The drain region 105 has a width w that is greater than the width d of the drain rectangular portion 113. In some embodiments, the width w of the drain region 105 is equal to the width d of the drain rectangular portion 113. The drain region 105 has a depth h with respect to a top surface 203 of the first layer 103 and the drain rectangular portion 113 has a depth q with respect to the top surface 203 of the first layer 103. In some embodiments, the depth h of the drain region 105 is greater than the depth q of the drain rectangular portion 113. In other embodiments, the depth h of the drain region 105 is equal to the depth q of the drain rectangular portion 113.

In some embodiments, the first well 127 and the second well 129 have depths that are equal to the depth q of the drain rectangular portion 113 with respect to the top surface 203 of the first layer 103. In other embodiments, the depths of the first well 127 and the second well 129 are different from the depth q of the drain rectangular portion 113 with respect to the top surface 203 of the first layer 103.

As seen in cross-section B-B', the drain rectangular portion 113 has the same doping type and a different doping concentration as compared to the drain region 105. For example, the drain rectangular portion 113 is an N+-doped region and the drain region 105 is n-type doped. Similarly, first source rectangular portion 119 and the second source rectangular portion 121 have the first well 127 that is formed within the source region 107, as well as the second well 129 that is formed within the source region 107. The second well 129 included within the first source rectangular portion 119 and the second source rectangular portion 121 has the same doping type and doping concentration as the drain rectangular portion 113 (i.e., N+ in this example).

The gate electrode layer 109 is over a portion of the source region 107 that is free from the first well 127 and the second well 129. In some embodiments, the gate electrode layer 109 is over at least a portion of the source region 107.

Figure 4:
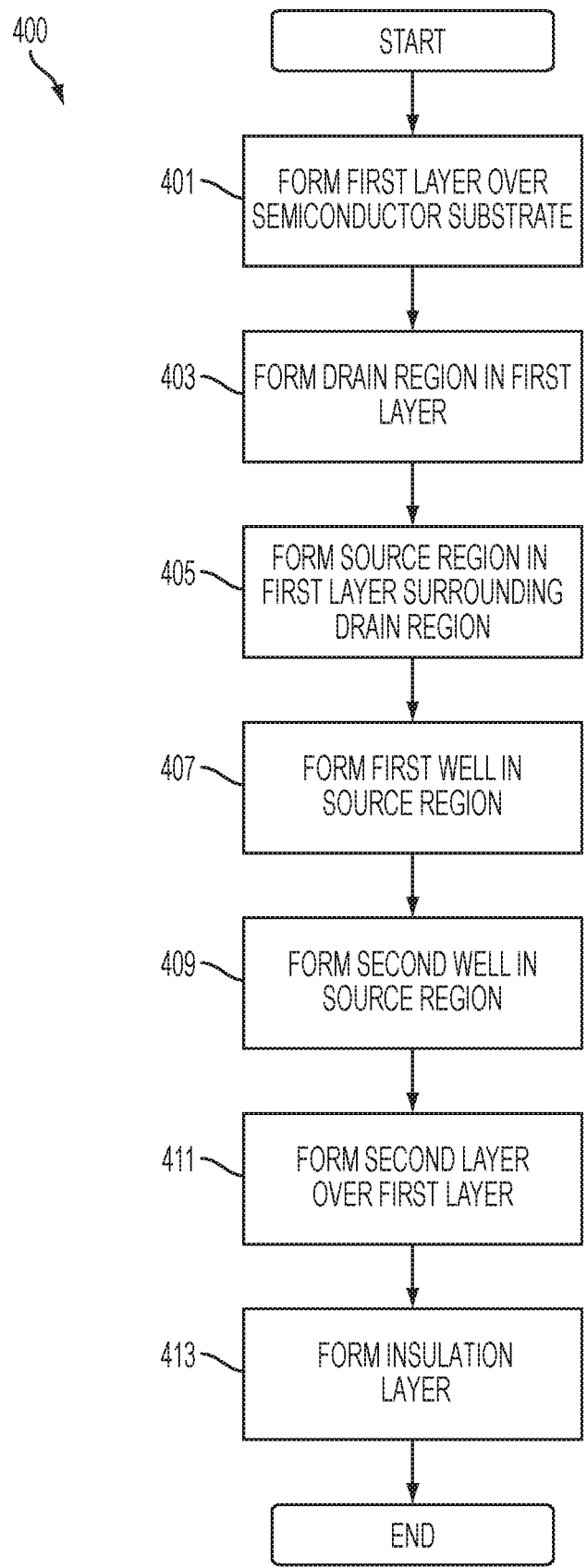
FIG. 4 is a method of manufacturing a semiconductor device having electrostatic discharge capabilities, in accordance with some embodiments.

FIG. 4 is a flowchart of a method 400 of manufacturing a semiconductor device such as semiconductor device 100 of FIGS. 1-3, in accordance with one or more embodiments.

Method 400 begins with step 401 in which a first layer is formed over a semiconductor substrate. The first layer is an epitaxial layer or oxide layer formed over the semiconductor substrate by a deposition process such as a physical vapor deposition (PVD) or chemical vapor deposition (CVD), oxidation process, or other suitable process.

In step 403, a drain region is formed in the first layer. The drain region is formed comprising a drain rectangular portion having a first end and a second end, a first drain end portion contiguous with the drain rectangular portion and extending from the first end of the drain rectangular portion away from a center of the drain region, and a second drain end portion contiguous with the drain rectangular portion and extending from the second end of the drain rectangular portion away from the center of the drain region. The drain rectangular portion has a length between the first end and the second end.

The first drain end portion and the second drain end portion are formed having a same doping type and a different doping concentration than the drain rectangular portion. For example, in some embodiments, the drain region is formed by doping or implanting n-type dopants, such as phosphorus, arsenic, or other suitable dopant; or a combination thereof, into a selected portion of the first layer.

The drain rectangular portion is formed as an N+ region by either forming an N+ well in the first layer that wholly occupies the drain region between the first drain end portion and the second drain end portion, or by forming a rectangular N+ well that partially occupies the drain region between the first drain end portion and the second drain end portion. In some embodiments, the drain rectangular portion and the drain region have different depths with respect to a top surface of the first layer and/or different widths in a direction perpendicular to the length of the drain rectangular portion. The drain rectangular portion is formed during or after formation of the drain region. That is, if the drain region is first entirely formed as an n-type doped region, and the drain rectangular portion is later formed as an N+ region within the previously formed drain region. Alternatively, the drain rectangular portion is formed at the same time as the first drain end portion and the second drain end portion.

In step 405, a source region is formed free from contact with and surrounding the drain region in the first layer. The source region is formed comprising a first source rectangular portion parallel to, and aligned with, the drain rectangular portion on a first side of the drain rectangular portion, a second source rectangular portion parallel to, and aligned with, the drain rectangular portion on a second side of the drain rectangular portion opposite the first side of the drain rectangular portion, a first source end portion coupling the first source rectangular portion to the second source rectangular portion on a first end side of the drain rectangular portion corresponding to the first end of the drain rectangular portion, and a second source end portion coupling the first source rectangular portion to the second source rectangular portion on a second end side of the drain rectangular portion corresponding to the second end of the drain rectangular portion.

In some embodiments, the source region is formed having a different doping type as compared to the drain region. For example, if the drain region is formed by doping or implanting n-type dopants, the source region is formed by doping or implanting p-type dopants, such as boron, $BF_2$, or other suitable dopant, into a selected portion of the first layer for forming the source region.

In step 407, a first well having a same doping type as the source region is formed in first source rectangular portion, the second source rectangular portion, the first source end portion and the second source end portion. The first well has a same doping type and a different doping concentration as compared to the source region. For example, if the source region is a p-type doped region, the first well is a P+ doped region.

In step 409, a second well having the same doping type and doping concentration as the drain rectangular portion is formed in the first source rectangular portion and the second source rectangular portion. For example, if the drain rectangular portion is an N+ doped region, the second well is an N+ doped region. The first source end portion and the second source end portion are free from having the second well. As such, in some embodiments, the first source end portion and the second source end portion are formed being entirely P-doped. In some embodiments, if the drain rectangular portion is formed after forming the drain region, the drain rectangular portion is optionally formed at the same time as the second well in the source region.

In step 411, a second layer comprising a gate electrode is formed over the first layer by a deposition or application process. The second layer is formed over the source region, and free from being in contact with the drain region.

In step 413, an insulation layer comprising an oxide is formed over, or at least partially within, the first layer by an oxidation or deposition process between the source region and the drain region.

An aspect of this description relates to a semiconductor device comprising a semiconductor substrate, a first layer over the semiconductor substrate, and a drain region in the first layer. The drain region comprises a drain rectangular portion having a first end and a second end, a first drain end portion contiguous with the drain rectangular portion and extending from the first end of the drain rectangular portion away from a center of the drain region, and a second drain end portion contiguous with the drain rectangular portion and extending from the second end of the drain rectangular portion away from the center of the drain region. The semiconductor device also comprises a source region free from contact with and surrounding the drain region in the first layer. The first drain end portion and the second drain end portion have a same doping type and a different doping concentration than the drain rectangular portion.

Another aspect of this description relates to a method comprising forming a first layer over a semiconductor substrate. The method also comprises forming a drain region in the first layer. The drain region is formed comprising a drain rectangular portion having a first end and a second end, a first drain end portion contiguous with the drain rectangular portion and extending from the first end of the drain rectangular portion away from a center of the drain region, and a second drain end portion contiguous with the drain rectangular portion and extending from the second end of the drain rectangular portion away from the center of the drain region. The method also comprises forming a source region free from contact with and surrounding the drain region in the first layer. The first drain end portion and the second drain end portion are formed having a same doping type and a different doping concentration than the drain rectangular portion.

Still another aspect of this description relates to a semiconductor device comprising a semiconductor substrate, a first layer over the semiconductor substrate, and a drain region having a first doping type in the first layer. The drain region comprises a drain rectangular portion having a first end and a second end, a semicircular first drain end portion contiguous with the drain rectangular portion, the semicircular first drain end portion having a lower doping concentration than the drain rectangular portion, and a semicircular second drain end portion contiguous with the drain rectangular portion, the semicircular second drain end portion having the same doping concentration as the semicircular first drain end portion. The semiconductor device also comprises a source region free from contact with and surrounding the drain region in the first layer. Some of the source region has the same doping type and the same doping concentration as the drain rectangular portion in an area parallel to the drain rectangular portion, and the source region is entirely free from having the same doping type and the same doping concentration as the drain rectangular portion in an area concentric with the semicircular first drain end portion and an area concentric with the semicircular second drain end portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device comprising:
    providing a first layer over a semiconductor substrate;
    forming a drain region in the first layer, wherein the forming the drain region comprises:
        performing a first implanting process to form an initial drain region with a first concentration of dopants and extending from a first surface to a first depth in the first layer, the first implanting process forming the initial drain region having a rectangular well portion interposing and a first drain end portion and a second drain end portion, each of the first drain end portion and the second drain end portion having an interface with and end of the rectangular well portion, the interface extending downward from the first surface; and
        performing a second implanting process to form the rectangular well portion having a second concentration of the dopants within the initial drain region, wherein the second concentration is greater than the first concentration and wherein the first drain end portion and the second drain end portion of the initial drain region are maintained at the first concentration including the first surface, the first depth, and the interfaces with the rectangular well portion during the second implanting process; and
    forming a source region spaced a distance from and surrounding the drain region in the first layer.

2. The method of claim 1, wherein the first implanting process includes introducing n-type dopants to form the initial drain region, and wherein the second implanting process includes introducing n-type dopants to form the rectangular well portion of the second concentration of N+.

3. The method of claim 2, wherein the forming the source region includes implanting p-type dopants.

4. The method of claim 1, wherein the first implanting process defines circular edges for the first drain end portion and the second drain end portion.

5. The method of claim 1, further comprising: forming a gate electrode over the source region.

6. The method of claim 1, further comprising: forming an oxide region between the drain region and the source region.

7. A method comprising:
    growing a first layer over a semiconductor substrate;
    forming a drain region in the first layer wherein the drain region has a length extending from a first terminal point to a second terminal point and a width, the length being greater than the width, wherein the drain region has a first circular end region including the first terminal point and a second circular end region including the second terminal point, the first and second circular end regions having a first concentration of a second dopant type and a rectangular intermediate portion extending between the first and second circular end regions having a second concentration of the second dopant type, greater than the first concentration;
    forming a source region of a first dopant type at a first concentration in the first layer, wherein the source region is spaced a distance from and surrounding the drain region in the first layer;
    implanting the first dopant type to form a first well of a second concentration in the source region, wherein the second concentration is greater than the first;
    implanting a second dopant type to form a second well in the source region, wherein the second dopant type is different than the first dopant type; and
    forming a gate electrode over the first layer.

8. The method of claim 7, further comprising:
    wherein the forming the gate electrode forms the gate electrode over the source region.

9. The method of claim 7, further comprising:
    forming a dielectric layer between the source region and the drain region.

10. The method of claim 9, wherein the gate electrode is formed at least partially over the dielectric layer.

11. The method of claim 9, wherein the forming the dielectric layer includes forming a trench between the source region and the drain region, wherein the dielectric layer is formed in the trench.

12. The method of claim 7, wherein a portion of the drain region is formed at a same time as implanting the second dopant type to form the second well in the source region.

13. The method of claim 7, wherein the forming the drain region includes providing the second dopant type.

14. The method of claim 7, wherein the forming the drain region in the first layer includes:
    performing a first implant to form an area with a first concentration of a second dopant type; and
    performing a second implant to form a rectangular well portion of a second concentration of the second dopant type within the area, wherein the second concentration is greater than the first concentration wherein a first drain end portion and a second drain end portion are maintained at the first concentration during the implanting of the second concentration.

15. The method of claim 14, wherein the second dopant type is n-type dopants.

16. A method comprising:
forming a drain region of a first dopant type having a rectangular portion, a first drain end portion, and a second drain end portion;
forming a source region of a second dopant type, wherein the source region is spaced a distance from and surrounding the drain region;
wherein the forming the source region includes:
 forming the source region having the second dopant type;
 forming a first well of an increased concentration of the second dopant type in the source region; and
 implanting the first dopant type to form a second well within the source region;
forming a gate electrode over the source region;
forming a first oxide layer between the drain region and the source region; and
forming a second oxide layer interfacing an edge of the first well of the increased concentration.

17. The method of claim 16, wherein the forming the first oxide layer and the forming the second oxide layer include oxidation to form a respective field oxide (FOX) region.

18. The method of claim 16, wherein the first oxide layer extends from an edge of the drain region and an edge of the source region.

19. The method of claim 16, wherein the forming the drain region including forming the rectangular portion of a first concentration of the first dopant type and the first drain end portion and the second drain end portion have a second concentration of the first dopant type, the second concentration is less than the first concentration.

20. The method of claim 16, wherein implanting the first dopant type to form the second well within the source region is performed at a same time as implanting the rectangular portion of the drain region.

* * * * *